(12) United States Patent
Johnson et al.

(10) Patent No.: US 8,970,301 B2
(45) Date of Patent: Mar. 3, 2015

(54) METHOD FOR LOW POWER LOW NOISE INPUT BIAS CURRENT COMPENSATION

(71) Applicant: Analog Devices, Inc., Norwood, MA (US)

(72) Inventors: Rayal Johnson, Cambridge, MA (US); Moshe Gerstenhaber, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 64 days.

(21) Appl. No.: 13/897,619

(22) Filed: May 20, 2013

(65) Prior Publication Data

US 2014/0340149 A1 Nov. 20, 2014

(51) Int. Cl.
*H03F 3/45* (2006.01)
(52) U.S. Cl.
USPC ............ 330/257; 330/261; 330/296; 327/362
(58) Field of Classification Search
USPC ........................... 330/257, 261, 296; 327/362

IPC .......................................................... H03F 3/45
See application file for complete search history.

(56) References Cited

U.S. PATENT DOCUMENTS

| | | | | |
|---|---|---|---|---|
| 4,019,121 A | * | 4/1977 | Feindt | 323/315 |
| 4,866,312 A | * | 9/1989 | Kearney et al. | 327/103 |
| 4,908,527 A | * | 3/1990 | Van Antwerp | 327/511 |
| 4,990,803 A | * | 2/1991 | Gilbert | 327/351 |
| 5,157,322 A | * | 10/1992 | Llewellyn | 323/315 |
| 5,610,547 A | * | 3/1997 | Koyama et al. | 327/350 |
| 6,236,254 B1 | | 5/2001 | Morgan et al. | |
| 6,292,050 B1 | * | 9/2001 | Dooley et al. | 327/540 |
| 6,417,735 B1 | | 7/2002 | Luo | |
| 6,636,111 B1 | * | 10/2003 | Gross et al. | 327/589 |
| 7,233,208 B2 | | 6/2007 | Greene | |

* cited by examiner

*Primary Examiner* — Patricia Nguyen
(74) *Attorney, Agent, or Firm* — Knobbe, Martens, Olson & Bear, LLP

(57) ABSTRACT

Low power low noise input bias current compensation for an amplifier input stage is provided by recycling the tail current of the differential pair transistors. A local amplifier regulates the tail current and buffers the base current of the tail current transistor, which is mirrored back to the input transistors to provide input bias current compensation.

20 Claims, 2 Drawing Sheets

METHOD FOR LOW POWER LOW NOISE INPUT BIAS CURRENT COMPENSATION

INCORPORATION BY REFERENCE TO RELATED APPLICATIONS

Any and all priority claims identified in the Application Data Sheet, or any correction thereto, are hereby incorporated by reference under 37 CFR 1.57.

BACKGROUND

Ideally, no current flows into the input terminal of an amplifier. In practice, however, there are two input bias currents, $I_{B+}$, $I_{B-}$. These currents times the external impedance associated with the signal driving the input causes a voltage which is an error voltage between the actual signal and what the amplifier sees.

Compensating for the input bias current reduces this error voltage, but typically increases the standing current, increases the input current noise, and limits the bandwidth of the amplifier. For example, compensating for the input bias current by supplying a current equal to half the tail current of the amplifier's differential pair through a transistor that is similar to the input transistors and mirroring the base current of this secondary transistor back to the input transistors' bases increases the standing current and the input current noise. Another method buffers the collector current of the differential input transistors with cascode transistors and mirrors the base currents of the cascode transistors back to the input of the amplifier, but limits the bandwidth and positive common mode range of the amplifier because the cascode transistors are in the signal path.

SUMMARY

Systems and methods for an amplifier having low power, low noise input bias current compensation without increasing the power requirements beyond that consumed for input noise are provided.

An embodiment comprises a differential amplifier input stage including a pair of differential input transistors, and a compensation circuit including a current source, a local amplifier and a current mirror. The compensation circuit recycles the tail current of the differential pair input stage through negative feedback. The compensation circuit mirrors the base current of the tail current via the local amplifier to the bases of the input transistors. Since the tail current is approximately twice that of a single input transistor, the current noise is reduced when mirrored by a factor of approximately half as compared to a transistor with approximately half the current. The compensation circuit is outside the differential amplifier signal path and therefore does not affect bandwidth. The local amplifier consumes little power because it is not in the differential signal path. Except for a small current for the local amplifier, there is approximately no increase in the standing power of the operational amplifier. In addition, the local amplifier is isolated from the common mode signal path. For very low voltage noise inputs, embodiments provide compensation for the amplifier using little power without a significant increase in current noise and without adversely affecting the signal path.

The present disclosure provides systems and methods to compensate for amplifier input bias current. In an embodiment, an amplifier comprises an input circuit, a first current source transistor, a local amplifier, a first current buffer transistor, and a current mirror. In some embodiments, the input circuit comprises a first input transistor and a second input transistor, where the first input transistor comprises an emitter electrically connected to an emitter of the second input transistor and a base configured to receive a first input signal and a first compensation current and where the second input transistor comprises a base configured to receive a second input signal and a second compensation current. In other embodiments, the input circuit comprises an emitter-coupled differential transistor pair configured to receive a first input signal and a first compensation current at a first input terminal and a second input signal and a second compensation current at a second input terminal.

In some embodiments, the first current source transistor comprises a collector electrically coupled to the emitters of the first and second input transistors and an emitter electrically connected to a first terminal of a resistor. In other embodiments, the first current source transistor comprises a collector electrically coupled to emitters of the emitter-coupled differential transistor pair, and an emitter electrically coupled to a first terminal of a resistor. The first input transistor, the second input transistor, and the current source transistor comprises a same type of transistor. The local amplifier comprises a first input electrically connected to the first terminal of the resistor, and a second input receiving a first voltage. The first current buffer transistor comprises a base electrically connected to an output of the local amplifier, an emitter electrically connected to a base of the current source transistor, and a collector configured to provide a third compensation current.

The current mirror is configured to receive the third compensation current and to provide the first compensation current and the second compensation current. The current mirror comprises a current mirror diode comprising a cathode electrically connected to the collector of the current buffer transistor, a first current mirror transistor comprising a collector configured to provide at least a portion of the compensation current and electrically connected to the base of the first input transistor, and a second current mirror transistor comprising a collector configured to provide at least another portion of the compensation current and electrically connected to the base of the second input transistor. The second current mirror transistor further comprises a base electrically connected to a base of the first current mirror transistor and a cathode of the first current mirror diode.

In certain embodiments, an amplifier is provided that comprises an input circuit, a current source, a local amplifier, a first current buffer transistor, and a current mirror. In some embodiments, the input circuit comprises a first input transistor and a second input transistor where the first input transistor comprises an emitter electrically connected to an emitter of the second input transistor and a base configured to receive a first input signal and a first compensation current, and where the second input transistor comprises a base configured to receive a second input signal and a second compensation current. In other embodiments, the input circuit comprises an emitter-coupled differential transistor pair configured to receive a first input signal and a first compensation current at a first input terminal and a second input signal and a second compensation current at a second input terminal.

The current source is configured to provide the tail current of the first and second input transistors and comprises a current source transistor and a resistor. The current source transistor comprises a collector electrically connected to the emitters of the first and second input transistors and an emitter electrically connected to a first terminal of the resistor, where the first input transistor, the second input transistor, and the current source transistor comprise a same type of transistor.

The local amplifier comprises a first amplifier transistor, a second amplifier transistor, a third amplifier transistor, and a fourth amplifier transistor. The first amplifier transistor comprises a base electrically connected to the first terminal of the resistor and an emitter electrically coupled to an emitter of the second amplifier transistor. The second amplifier transistor comprises a base and a collector electrically connected to a base of the third amplifier transistor and to a first terminal of a current source. The fourth amplifier transistor comprises an emitter electrically connected to an emitter of the third amplifier transistor and a base configured to receive a power supply voltage and electrically connected to a collector of the fourth amplifier transistor, where a voltage across the resistor is based at least in part on the physical characteristics of the first, second, third, and fourth amplifier transistors. The first current buffer transistor comprises a base electrically connected to a collector of the third amplifier transistor and an emitter electrically connected to a base of the current source transistor.

The current mirror is configured to receive a third compensation current and provide the first compensation current and the second compensation current. The current mirror comprises a first diode-connected current mirror transistor comprising a collector electrically connected to a collector of the current buffer transistor, a second current mirror transistor comprising a collector configured to provide at least a portion of the third compensation current and electrically connected to the base of the first input transistor, and a third current mirror transistor comprising a collector configured to provide at least another portion of the third compensation current and electrically connected to the base of the second input transistor. The third current mirror transistor further comprises a base electrically connected to a base of the second current mirror transistor and a base of the first current mirror transistor.

In some embodiments, a method to compensate for amplifier input bias current is provided. The method comprises receiving a first compensation current at a first input of an emitter-coupled differential input transistor pair of an amplifier and receiving a second compensation current at a second input of the emitter-coupled differential input transistor pair, and providing a tail current of the emitter-coupled differential input transistor pair from a current source comprising a current source transistor and a degeneration resistor, where a collector of the current source transistor is configured to provide the tail current.

The method further comprises regulating the tail current through the degeneration resistor by setting a positive input of a local amplifier to a voltage, electrically connecting a negative input of the local amplifier to a node formed between a first terminal of the degeneration resistor and an emitter of the current source transistor, and electrically connecting an output of the local amplifier to a base of a common base transistor. An emitter of the common base transistor is electrically connected to a base of the current source transistor, and a collector of the common base transistor is configured to provide a third compensation current to a current mirror. The method further comprises mirroring, using the current mirror, the third compensation current by approximately half to each of the first and second inputs of the emitter-coupled differential input transistor pair to provide the first and second compensation currents. The emitter-coupled differential input transistor pair and the current source transistor comprises the same type of transistor.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF EMBODIMENTS

Embodiments of an amplifier circuit mirror the buffered base current of the tail current source of a differential pair back to the input by way of a local amplifier that regulates the desired current in the tail current source and provides the voltage reference for the common base stage current buffer. The positive input of the local amplifier is set to a desired voltage and the negative input electrically connects to the degeneration resistor of the tail current source. The output of the local amplifier electrically connects to the base of a transistor operating as a common base stage and the emitter of the common base stage electrically connects to the base of the tail current source. The collector of the common base stage provides approximately twice the compensation current for the differential pair. The correct tail current is forced through negative feedback by setting the voltage on the base of the common-base stage to make the voltage across the degeneration resistor approximately that of the positive input of the local amplifier.

The local amplifier is referenced to the same supply as the tail current circuit and is outside the differential signal path. Since the tail current is recycled, no extra standing current beyond the small amount used by the local amplifier is consumed by the overall amplifier circuit. The recycled current therefore provides the compensation current for the amplifier circuit.

Figure 1:
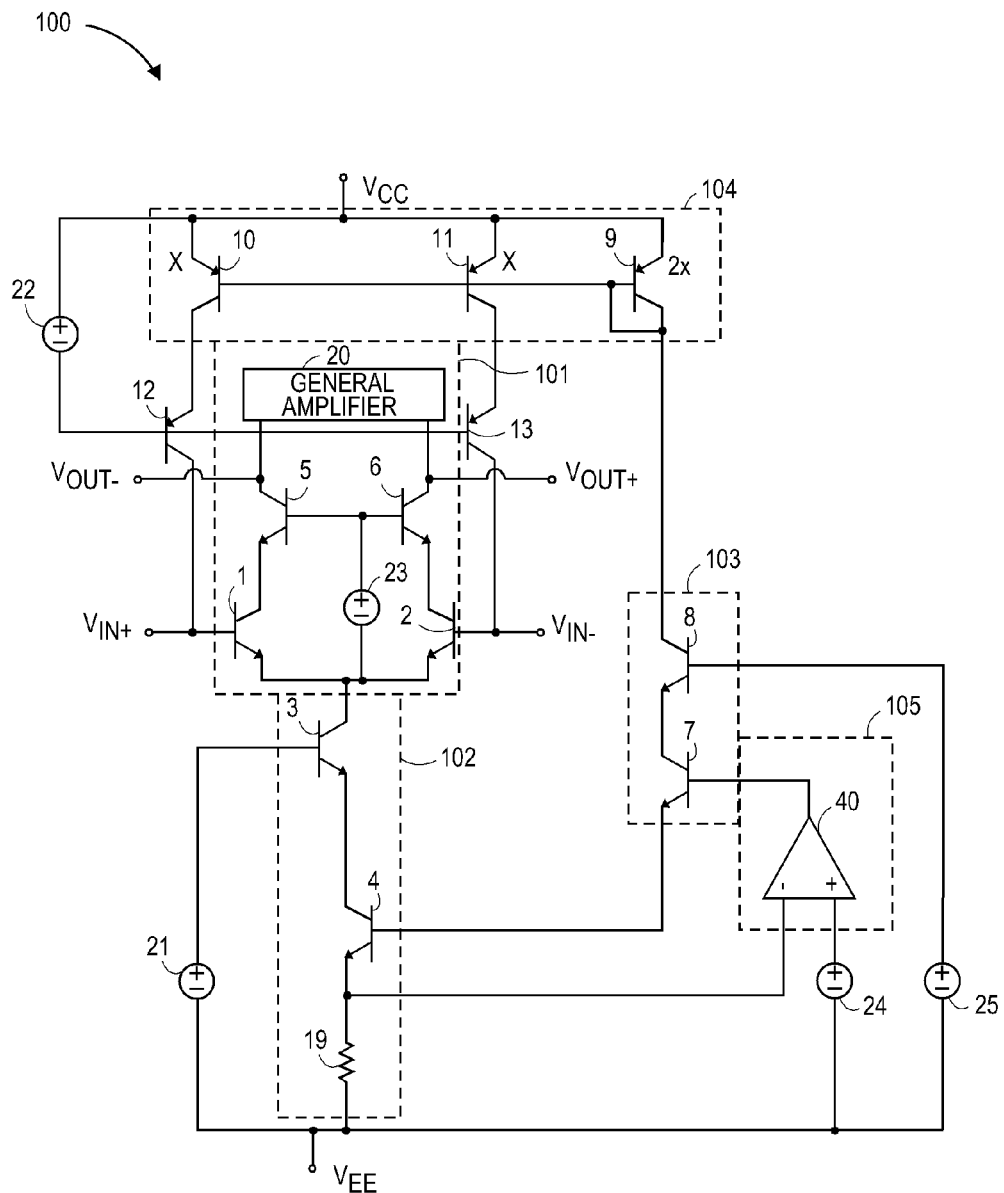
FIG. 1 is a schematic of an exemplary amplifier circuit comprising low power low noise input bias current compensation circuit, according to certain embodiments.

FIG. 1 is a schematic diagram of an exemplary amplifier circuit 100. In an embodiment, the amplifier circuit 100 comprises an amplifier input stage with low power low noise input bias current compensation. The amplifier circuit 100 is configured to receive a differential input signal $V_{IN+}$, $V_{IN-}$ and to generate a differential output signal $V_{OUT+}$, $V_{OUT-}$ that includes compensation for input bias current. The differential input signal $V_{IN+}$, $V_{IN-}$ can signal information as a difference between a first or non-inverted input signal $V_{IN+}$ and a second or inverted input signal $V_{IN-}$. Additionally, the differential input signal $V_{IN+}$, $V_{IN-}$ can include an error voltage caused by the input bias current $I_{B+}$, $I_{B-}$. The differential output signal $V_{OUT+}$, $V_{OUT-}$ can signal information as a difference between a first or non-inverted output signal $V_{OUT+}$ and a second or inverted output signal $V_{OUT-}$ where the differential output signal $V_{OUT+}$, $V_{OUT-}$ includes compensation for the error voltage caused by the input bias current $I_{B+}$, $I_{B-}$. A general amplifier circuit 20 receives the differential output signal $V_{OUT+}$, $V_{OUT-}$. The general amplifier circuit 20 represents the circuit receiving the output from the amplifier input stage 100. For example, the general amplifier circuit 20 can be a second or additional amplifier stage, an active load, such as a current mirror for a differential to single-ended output, a load receiving the differential output signal $V_{OUT+}$, $V_{OUT-}$, or the like.

The amplifier circuit 100 includes an amplifying circuit 101, a tail current source circuit 102, a current buffer circuit 103, a current mirror circuit 104, and a local amplifier circuit

105. The amplifier circuit 100 further includes a first voltage source 21, a second voltage source 22, a third voltage source 23, a fourth voltage source 24, a fifth voltage source 25, a first PNP current buffer transistor 12, and a second PNP current buffer transistor 13.

The amplifying circuit 101 includes a first NPN input transistor 1, a second NPN input transistor 2, a first NPN cascode transistor 5, and a second NPN cascode transistor 6. The tail current source circuit 102 includes a first NPN tail current transistor 3, a second NPN tail current transistor 4, and a degeneration resistor 19. The current buffer circuit 103 includes a third NPN current buffer transistor 7 and a fourth NPN current buffer transistor 8. The current mirror circuit 104 includes a first PNP current mirror transistor 9, a second PNP current mirror transistor 10, and a third PNP current mirror transistor 11. The local amplifier circuit 105 includes a local amplifier 40.

The amplifying circuit 101 is configured to receive the differential input signal $V_{IN+}$, $V_{IN-}$ and to output the differential output signal $V_{OUT+}$, $V_{OUT-}$ which includes input bias current compensation. In an embodiment, the first NPN input transistor 1 and the second NPN input transistor 2 are configured as a differential emitter-coupled pair 1, 2 of the amplifier input stage 100.

The first NPN input transistor 1 includes a base configured to receive the non-inverted input signal $V_{IN+}$, and an emitter electrically connected to a first terminal of the third voltage source 23 and to a collector of the first NPN tail current transistor 3 at a node configured to provide the tail current to the first and second NPN input transistors 1, 2. The second NPN input transistor 2 includes a base configured to receive the inverted input signal $V_{IN-}$, and an emitter electrically connected to the first terminal of the third voltage source 23 and to the collector of the first NPN tail current transistor 3 at the node configured to provide the tail current to the first and second NPN input transistors 1, 2.

The first NPN input transistor 1 further includes a collector electrically connected to an emitter of the first NPN cascode transistor 5. The first NPN cascode transistor 5 further includes a base electrically connected to a second terminal of the third voltage source 23 and to a base of the second NPN cascode transistor 6, and further includes a collector electrically connected to a first terminal of the general amplifier circuit 20 at a node configured to generate the inverted output signal $V_{OUT-}$. The second NPN cascode transistor 6 further includes an emitter electrically connected to a collector of the second NPN input transistor 2 and further includes a collector electrically connected to a second terminal of the general amplifier circuit 20 at a node configured to generate the non-inverted output signal $V_{OUT+}$. In an embodiment, the third voltage source 23 can be used to bias the bases of the first and second NPN cascode transistors 5, 6. In another embodiment, the third voltage source 23 isolates the first and second NPN input transistors 1, 2 from changes in common mode voltages.

The tail current source circuit 102 is configured to generate the desired tail current of the input differential pair 1, 2.

The tail current $I_{TAIL}$ of the tail current source circuit 102 is approximately twice the current that flows into either of the first and second NPN input transistors 1, 2, (i.e. $I_{TAIL}/2$). For bipolar transistors which typically have a current gain ($\beta$) of the order of approximately 100, such as for example 30<$\beta$<500, the base currents are small compared with the collector or emitter currents, making the collector current approximately equal to the emitter current.

The input bias current $I_{IN+}$, $I_{IN-}$, which is the base currents of the input transistors 1, 2 absent the compensation currents, is $(1/\beta)^{th}$ of the currents flowing in the collectors of the first and second NPN input transistors 1, 2. The base currents of the first and second NPN input transistors 1, 2 are $(I_{TAIL}/2)/\beta$ and the base current of the second NPN tail current transistor 4 in the tail current source circuit 102 is the sum of the base current in each input transistor 1, 2 or $(I_{TAIL})/\beta$. The base current of the tail current source circuit 102, is approximately twice the base currents of the first and second NPN input transistors 1, 2 if the first and second NPN input transistors 1, 2 and the second NPN tail current transistor 4 are the same type of transistor having approximately the same current gain ($\beta$) value.

In an embodiment, the first and second NPN input transistors 1, 2 and the second NPN tail current transistor 4 comprise super-beta (SB) transistors, which, for example, have a current gain ($\beta$) of approximately 50 to approximately 100 times that of a typical bipolar transistor. In another embodiment, the first and second NPN input transistors 1, 2 and the second NPN tail current transistor 4 comprise bipolar transistors. In another embodiment, the first and second NPN input transistors 1, 2 and the second NPN tail current transistor 4 comprise the same type of transistor.

Embodiments mirror the base current of the tail current source circuit 102, after dividing by two, back to the inputs $V_{IN+}$, $V_{IN-}$ of the amplifier circuit 100 to provide the base current or the compensation current for the first and second NPN input transistors 1, 2. Thus, there is no bias input current $I_{IN+}$, $I_{IN-}$ as seen from outside the amplifier circuit 100.

The tail current source circuit 102 provides the tail current $I_{TAIL}$ to the differential input transistor pair 1, 2 at the collector of the first NPN tail current transistor 3. The first NPN tail current transistor 3 further includes a base electrically connected to a first terminal of the first voltage source 21. A second terminal of the first voltage source 21 electrically connects to a first power supply voltage $V_{EE}$, which can be, for example, ground or power low supply. In an embodiment, the first voltage source 21 along with the first NPN tail current transistor 3 isolates the second NPN tail current transistor 4 from changes in input common mode voltages, i.e., $V_{IN+}$ and $V_{IN-}$ tied together and increased or decreased in voltage. The first NPN tail current transistor 3 further includes an emitter electrically connected to a collector of the second NPN tail current transistor 4. The second NPN tail current transistor 4 further includes an emitter electrically connected to a first terminal of the degeneration resistor 19, and a second terminal of the degeneration resistor 19 electrically connects to the first power supply voltage $V_{EE}$.

The local amplifier circuit 105 recycles the base current of the tail current transistor. In an embodiment, the local amplifier circuit 105 is configured to regulate the value of the current in the tail current source 102 to be what the user desires it to be. Further, the local amplifier circuit 105 provides a bias to the third NPN current buffer transistor 7 in the current buffer circuit 103.

For example, if the local amplifier circuit 105 did not provide feedback to the tail current source circuit 102, and was replaced with a DC voltage source coupling the base of the third NPN current buffer transistor 7 to the first power supply voltage VEE, then the tail current would be uncontrolled and dependent on the current gain ($\beta$) of the second NPN tail current transistor 4. In such a case, the bias compensation would be uncontrolled.

The positive input of the local amplifier 40 is set to a desired voltage and the negative input electrically connects to the degeneration resistor 19 of the tail current source circuit 102. The local amplifier output electrically connects to the base of the third NPN current buffer transistor 7 operating as a common base stage and the emitter of the third NPN current buffer transistor 7 electrically connects to the base of the second NPN tail current transistor 4. The emitter of the third NPN current buffer transistor 7 operating as a common base stage contains approximately twice the compensation current.

The local amplifier 40 includes a negative input electrically connected to a node formed between the emitter of the second NPN tail current transistor 4 and the first terminal of the degeneration resistor 19, and further includes a positive input electrically connected to a first terminal of the fourth voltage source 24. A second terminal of the fourth voltage source 24 electrically connects to the first power supply voltage $V_{EE}$. The local amplifier 40 further includes an output electrically connected to a base of the third NPN current buffer transistor 7. In an embodiment, the fourth voltage source 24 is the voltage across the degeneration resistor 19 and is chosen by the user. In an embodiment, it could be made low to allow the inputs of the overall amplifier to get closer to the negative supply $V_{EE}$. For example, when the voltage is approximately 50 mV, the value of the degeneration resistor 19 is approximately 50 mV/$I_{TAIL}$ to provide the desired tail current to achieve an input voltage noise target.

The current buffer circuit 103 is configured to receive and buffer the third compensation current which is approximately twice the first and second compensation currents ($2I_{COMP}$) provided at an emitter of the third NPN current buffer transistor 7. The current buffer circuit 103 is further configured to operate as a common base stage, which forces the desired tail current of the differential pair 1, 2 through the tail current source circuit 102. The desired tail current comprises the sum of the desired emitter currents of each input transistor 1, 2. Thus, the compensation current provided by the current buffer circuit 103 to the current mirror circuit 104 comprises approximately twice the compensation current for each of the first and second NPN input transistors 1, 2.

The third NPN current buffer transistor 7 further includes an emitter electrically connected to a base of the second NPN tail current transistor 4, and further includes a collector electrically connected to an emitter of the fourth NPN current buffer transistor 8. The fourth NPN current buffer transistor 8 further includes a base electrically connected to a first terminal of the fifth voltage source 25, and a second terminal of the fifth voltage source 25 electrically connects to the first power supply voltage $V_{EE}$. The fourth NPN current buffer transistor 8 further includes a collector electrically connected to the current mirror circuit 104. In an embodiment, the fifth voltage source 25 and the fourth current buffer transistor 8 help to prevent the compensation current $I_{COMP}$ from depending on power supply voltages $V_{CC}$, $V_{EE}$.

The current mirror circuit 104 is configured to mirror the approximately twice the compensation current ($2I_{COMP}$) received from the current buffer circuit 103. The current mirror 104 is further configured to divide by approximately two the mirrored compensation current. The current mirror circuit 104 comprises three transistors 9, 10, 11. In an embodiment, the area of each of the second and third PNP current mirror transistors 10, 11 is approximately ½ of the area of the first PNP current mirror transistor 9. In another embodiment, the aspect ratio (width/length) of each of the each of the second and third PNP current mirror transistors 10, 11 is approximately ½ of the aspect ratio of the first PNP current mirror transistor 9. Thus, the current mirrored in each of the second and third PNP current mirror transistors 10, 11 is approximately half of the current from the first PNP current mirror transistor 9 or in other words, approximately ½($2I_{COMP}$).

The first PNP current mirror transistor 9, configured as a diode, includes a base electrically connected to a collector of the first PNP current mirror transistor 9, and can be referenced as current mirror diode 9. The base/collector of current mirror transistor 9 or the cathode of current mirror diode 9 further electrically connects to the collector of the fourth NPN current buffer transistor 8, to a base of the second PNP current mirror transistor 10, and to a base of the third PNP current mirror transistor 11. Each of the first, second, and third PNP current mirror transistors 9, 10, 11 further include an emitter electrically connected to a second power supply voltage $V_{CC}$, which can be for example, power high supply. The second PNP current mirror transistor 10 further includes a collector electrically connected to an emitter of the first PNP current buffer transistor 12, and the third PNP current mirror transistor 11 further includes a collector electrically connected to an emitter of the second PNP current buffer transistor 13. The first current mirror transistor 9 receives approximately twice the compensation current ($2I_{COMP}$) from the current buffer circuit 103.

The first and second PNP current buffer transistors 12, 13 are configured to buffer the compensation currents from the current mirror circuit 104 back to the first and second NPN input transistors 1, 2, respectively.

The first PNP current buffer transistor 12 further includes a base electrically connected to a base of the second PNP current buffer transistor 13 and to a first terminal of the second voltage source 22 A second terminal of the second voltage source 22 electrically connects to the second power supply voltage $V_{CC}$. In an embodiment, the second voltage source 22 along with the first and second PNP current buffer transistors 12 and 13 isolates second and third PNP current mirror transistors 10, 11 from common mode inputs. The first PNP current buffer transistor 12 further includes a collector electrically connected to the base of the first NPN input transistor 1 at the $V_{IN+}$ terminal and the second PNP current buffer transistor 13 further includes a collector electrically connected to the base of the second NPN input transistor 2 at the $V_{IN-}$ terminal.

Referring to FIG. 1, $$2I_{COMP}/V_{DEGEN} = [(A\beta_7/R_{IN})/[1+(A\beta_4\beta_7 R_{DEGEN}/R_{IN})]$$
$$\approx 1/\beta_4 R_{DEGEN}|_{A\to\infty}; \text{ thus } I_{COMP} = V_{DEGEN}/[2\beta_4 R_{DEGEN}]$$

$$I_{TAIL}/V_{DEGEN} = (A\beta_4\beta_7/R_{IN})/[1+(A\beta_4\beta_7 R_{DEGEN}/R_{IN})]$$
$$\approx 1/R_{DEGEN}|_{A\to\infty}; \text{ thus } I_{TAIL} = V_{DEGEN}/R_{DEGEN};$$

Therefore $2I_{COMP} = I_{TAIL}/\beta_4$.

where $I_{COMP}$ is the compensation current provided to each input transistor 1, 2;

$V_{DEGEN}$ is the voltage across the degeneration resistor 19;

A is the gain of the local amplifier 40;

$\beta_7$ is the current gain of the third NPN current buffer transistor 7;

$R_{IN}$ is the resistance seen looking into the base of transistor 7;

$\beta_4$ is the current gain of the second NPN current transistor 4;

$R_{DEGEN}$ is the resistance of the degeneration resistor 19; and $I_{TAIL}$ is the tail current flowing through the second NPN current transistor 4.

Although FIG. 1 illustrates one implementation of an according to the low noise low power input bias compensation schemes described herein, the teachings herein are applicable to other configurations of amplifiers. For example, the teachings herein are applicable to amplifiers including a different arrangement of components and/or more or fewer components. Furthermore, although FIG. 1 illustrates the bias compensation circuitry in the context of a local amplifier, other configurations are possible. For example, the teachings herein are applicable to other implementations of the local amplifier and complementary circuit configurations and/or to configurations using other types of transistors.

Figure 2:
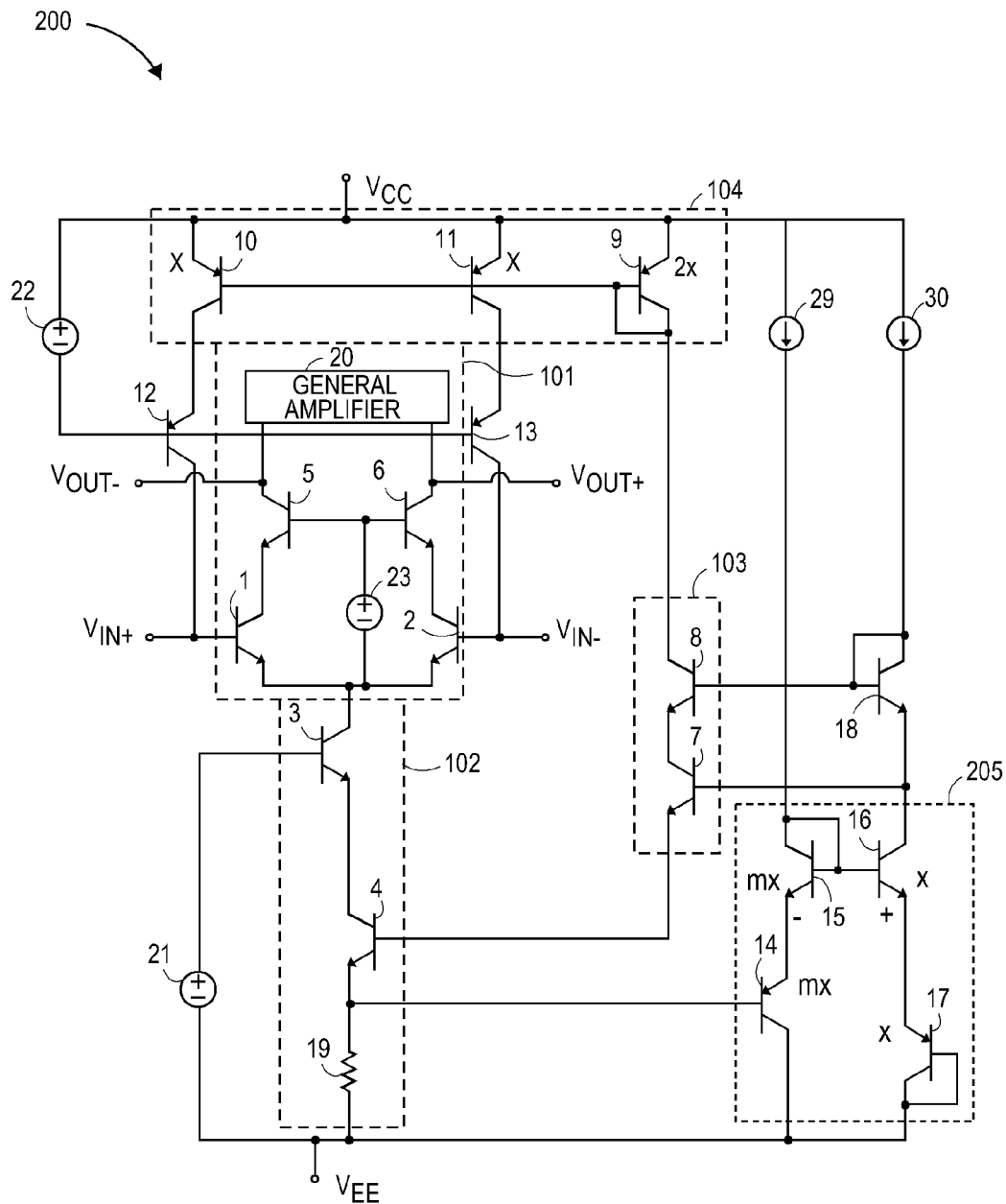
FIG. 2 is a schematic of an exemplary amplifier circuit comprising a low power low noise input bias current compensation circuit, according to other embodiments.

FIG. 2 is a schematic diagram of an exemplary amplifier circuit 200. In an embodiment, the amplifier circuit 200 comprises an amplifier input stage with low power low noise input bias current compensation. The amplifier circuit 200 is configured to receive a differential input signal $V_{IN+}, V_{IN-}$ including an error voltage caused by the input bias current signal $I_{IN+}, V_{IN-}$ and to generate a differential output signal $V_{OUT+}, V_{OUT-}$ including compensation for the input bias current signal $I_{IN+}, I_{IN-}$. The differential input signal $V_{IN+}, V_{IN-}$ can signal information as a difference between a first or non-inverted input signal $V_{IN+}$ and a second or inverted input signal $V_{IN-}$. Additionally, the differential input signal $V_{IN+}, V_{IN-}$ can include an error voltage caused by the input bias current $I_{B+}, B_{B-}$. The differential output signal $V_{OUT+}, V_{OUT-}$ can signal information as a difference between a first or non-inverted output signal $V_{OUT+}$ and a second or inverted output signal $V_{OUT-}$ where the differential output signal $V_{OUT+}, V_{OUT-}$ includes compensation for the error voltage caused by the input bias current $I_{B+}, I_{B-}$, as described above with respect to FIG. 1. The amplifier circuit 200 includes the amplifying circuit 101, the tail current source circuit 102, the current buffer circuit 103, the current mirror circuit 104, the first voltage source 21, the second voltage source 22, and the third voltage source 23, which can be as described earlier.

The amplifier circuit 200 further includes a local amplifier circuit 205, a first current source 29, a second current source 30, and a first diode-configured transistor 18. The local amplifier circuit 205 comprises a simple amplifier including a first PNP amplifier transistor 14, a second NPN amplifier transistor 15, a third NPN amplifier transistor 16, and a fourth PNP amplifier transistor 17. The fourth PNP amplifier transistor 17 can be a diode-configured transistor 17. The amplifier transistors 14-17 from a translinear loop, and in other embodiments, there are more or less than four amplifier transistors in the local amplifier circuit 205, as long as the number of amplifier transistors is an even number. In an embodiment, the area of each of the first PNP amplifier transistor 14 and the second NPN amplifier transistor 15 is m times the area of each of the third NPN amplifier transistor 16 and the fourth PNP amplifier transistor 17. In another embodiment, the aspect ratio (width/length) of each of the first PNP amplifier transistor 14 and the second NPN amplifier transistor 15 is m times the aspect ratio of each of the third NPN amplifier transistor 16 and the fourth PNP amplifier transistor 17. In an embodiment m=16. In other embodiments, m<16. In further embodiments, m>16.

The first PNP amplifier transistor 14 includes a base electrically connected to the node formed between the emitter of the second NPN tail current transistor 4 and the first terminal of the degeneration resistor 19. The first PNP amplifier transistor 14 further includes an emitter electrically connected to an emitter of the second NPN amplifier transistor 15, and further includes a collector electrically connected to the first power supply voltage $V_{EE}$. The second NPN amplifier transistor 15 includes a collector electrically connected to a base of the second NPN amplifier transistor 15, to a base of the third NPN amplifier transistor 16, and to a first terminal of the first current source 29. The third NPN amplifier transistor 16 includes an emitter electrically connected to an emitter of the fourth PNP amplifier transistor 17. The third NPN amplifier transistor 16 further includes a collector electrically connected to the base of the third NPN current buffer transistor 7, and to an emitter of the first diode-configured transistor 18. The first diode-configured transistor 18 further includes a collector electrically connected to a base of the first diode-configured transistor 18, to the base of the fourth NPN current buffer transistor 8, and to a first terminal of the second current source 30. Second terminals of the first and second current sources 29, 30 electrically connect to the second power supply voltage $V_{CC}$. The fourth PNP amplifier transistor 17 further includes a base electrically connected to a collector of the fourth PNP amplifier transistor 17 and to the first power supply voltage $V_{EE}$.

The areas or the aspect ratios of the amplifier transistors 14, 15, 16, 17 are used to determine the desired tail current $I_{TAIL}$ through the degeneration resistor 19 of the tail current source circuit 102. As indicated above, ratio of at least one of the aspect ratio or the transistor area of each of the first PNP amplifier transistor 14 and the second NPN amplifier transistor 15 to each of the third NPN amplifier transistor 16 and the fourth PNP amplifier transistor 17 is m. In an embodiment, the voltage across the degeneration resistor 19 is realized by looking at the translinear loop formed by amplifier transistors 14-17 and assuming that the first and second current sources 29, 30 are approximately equal. The voltage across the degeneration resistor 19 is controlled at least in part by the selected area/aspect ratio of the amplifier transistors 14-17, and is given by:

$$V = 2*(kT/q)*\ln(m), \text{ where}$$

k=Boltzmann constant;
T=temperature in degrees Kelvin;
q=charge of an electron;
m=the ratio of the area and/or aspect ratio of amplifier transistors 14, 15 to that of amplifier transistors 16, 17; and
ln=natural logarithm.

In the embodiment illustrated in FIG. 1, the local amplifier circuit 105 regulates the desired tail current at the tail current source circuit 102 and provides the compensation current through the current buffer circuit 103 to the current mirror circuit 104 by using the voltages set at voltage sources 24, 25. In the embodiment illustrated in FIG. 2, the voltage $[2*(kT/q)*\ln(m)]$ is analogous to the fourth voltage source 24, as each voltage is the voltage across the degeneration resistor 19. The fourth voltage source 24 in FIG. 1 is a discrete voltage source, while in FIG. 2 the voltage source has been integrated into the local amplifier circuit 205.

In FIG. 2, sums of the voltage across the degeneration resistor 19 $[2*(kT/q)*\ln(m)]$, the base-emitter voltage of the second NPN tail current transistor 4, the base-emitter voltage of the third NPN current buffer transistor 7, and the base-emitter voltage of the first diode-configured transistor 18 are analogous to the fifth voltage source 25.

Similar to that described above with respect to FIG. 1, the collector of the fourth NPN current buffer transistor 8 supplies approximately twice the compensation current $(2I_{COMP})$ to the current mirror circuit 104. The second PNP current mirror transistor 10 supplies approximately half of the approximately twice the compensation current or expressed as an equation $\frac{1}{2}(2I_{COMP})$ to the first NPN input transistor 1 via the first PNP current buffer transistor 12 and the third PNP current mirror transistor 11 supplies approximately half of the approximately twice the compensation current or in expressed as an equation $\frac{1}{2}(2I_{COMP})$ to the second NPN input transistor 2 via the second PNP current buffer transistor 13.

Thus, the circuit 200 compensates for the input bias current at the differential pair transistors 1, 2 by recycling the base current of the tail current source circuit 102 through the use of the local amplifier circuit 205 to generate the compensation current.

The above embodiments provide low power low noise input bias compensation by recycling the tail current of the differential amplifying transistors. Since the tail current is recycled, less power is used in the bias circuit to provide the input bias compensation than is used in circuits providing bias compensation without recycling current. In other embodiments, the low power low noise bias compensation is provided by recycling current from elsewhere in the differential amplifier. In one embodiment, a cascode transistor(s) similar to the input transistors is added to the second stage of an amplifier. The base current of these additional transistors is used to compensate the input bias current.

FIGS. 1 and 2 illustrate exemplary amplifier circuits 100, 200 with low power low noise input bias current compensation. In other embodiments, the amplifier circuits 100, 200 could be modified in various ways. For example, the amplifier circuits 100, 200 can utilize a complementary configuration which can be implemented using transistors of an opposite polarity type with a corresponding adjustment in the voltage supplies. It will be understood that any combination of features described with reference to NPN bipolar transistors can alternatively or additionally be implemented in connection with PNP bipolar transistors and similarly, any combination of features described with reference to PNP bipolar transistors can alternatively or additionally be implemented in connection with NPN bipolar transistors. Accordingly, the circuits shown are for illustration purposes and are not intended to limit embodiments to particular circuitry.

Voltage sources 21-25 can generate any suitable voltage level. In some configurations, the voltages of the voltage sources 21-25 can each be generated using a current source and diode connected transistors. In addition, as used herein, a current source can refer to either a current source or a current sink.

The methods, systems, and/or apparatus described above can be implemented into various electronic devices.

Examples of the electronic devices can include, but are not limited to, consumer electronic products, parts of the consumer electronic products, electronic test equipment, etc. Examples of parts of consumer electronic products can include amplifiers, rectifiers, programmable filters, attenuators, variable frequency circuits, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected," as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. An amplifier comprising:
  an input circuit comprising an emitter-coupled differential transistor pair configured to receive a first input signal and a first compensation current at a first input terminal and a second input signal and a second compensation current at a second input terminal;
  a first current source transistor comprising a collector electrically coupled to emitters of the emitter-coupled differential transistor pair, and an emitter electrically connected to a first terminal of a resistor;
  a local amplifier comprising a first input electrically connected to the first terminal of the resistor, and a second input receiving a first voltage;
  a first current buffer transistor comprising a base electrically connected to an output of the local amplifier, an emitter electrically connected to a base of the current source transistor, and a collector configured to provide a third compensation current; and a current mirror configured to receive the third compensation current and to provide the first compensation current and the second compensation current.

2. The amplifier of claim 1 wherein the emitter-coupled differential transistor pair comprises a first input transistor and a second input transistor, the first input transistor comprising an emitter electrically connected to an emitter of the second input transistor and a base configured to receive the first input signal and the first compensation current, the second input transistor comprising a base configured to receive the second input signal and the second compensation current.

3. The amplifier of claim 1 wherein the current mirror comprises a first current mirror transistor comprising a collector electrically connected to the collector of the current buffer transistor, a second current mirror transistor comprising a collector configured to provide at least a portion of the compensation current and electrically connected to the base of the first input transistor, and a third current mirror transistor comprising a collector configured to provide at least another portion of the compensation current and electrically connected to the base of the second input transistor, the third current mirror transistor further comprising a base electrically connected to a base of the second current mirror transistor and a base of the first current mirror transistor.

4. The amplifier of claim 1 wherein the current gain ($\beta$) of the first input transistor, the current gain of the second input transistor, and the current gain of the current source transistor are approximately the same.

5. The amplifier of claim 4 wherein the first input transistor, the second input transistor, and the current source transistor comprise super-beta transistors.

6. The amplifier of claim 1 further comprising a second current buffer transistor comprising an emitter electrically connected to the collector of the first current buffer transistor, a collector electrically connected to the collector of the first current mirror transistor, and a base configured to receive a second voltage.

7. The amplifier of claim 1 further comprising a second current source transistor comprising a collector electrically coupled to the emitters of the first and second input transistors, an emitter electrically coupled to the collector of the first current source transistor, and a base configured to receive a third voltage.

8. The amplifier of claim 1 further comprising a first cascode transistor and a second cascode transistor, the first cascode transistor comprising an emitter electrically connected to a collector of the first input transistor, a base configured to receive a fourth voltage and electrically connected to a base of the second cascode transistor, and a collector configured to provide a first output signal including input bias current compensation, the second cascode transistor comprising an emitter electrically connected to a collector of the second input transistor, and a collector configured to provide a second output signal including the input bias current compensation.

9. An amplifier comprising:
an input circuit comprising an emitter-coupled differential transistor pair configured to receive a first input signal and a first compensation current at a first input terminal and a second input signal and a second compensation current at a second input terminal;
a current source configured to provide a tail current of the emitter-coupled differential transistor pair and comprising a current source transistor and a resistor, the current source transistor comprising a collector electrically connected to emitters of the first and second input transistors, and an emitter electrically connected to a first terminal of the resistor;
a local amplifier comprising a first amplifier transistor, a second amplifier transistor, a third amplifier transistor, and a fourth amplifier transistor, the first amplifier transistor comprising a base electrically connected to the first terminal of the resistor and an emitter electrically coupled to an emitter of the second amplifier transistor, the second amplifier transistor comprising a base and a collector electrically connected to a base of the third amplifier transistor and to a first terminal of a current source, the fourth amplifier transistor comprising an emitter electrically connected to an emitter of the third amplifier transistor and a base configured to receive a power supply voltage and electrically connected to a collector of the fourth amplifier transistor;
a first current buffer transistor comprising a base electrically connected to a collector of the third amplifier transistor and an emitter electrically connected to a base of the current source transistor; and
a current mirror configured to receive a third compensation current and provide the first compensation current and the second compensation current.

10. The amplifier of claim 9 wherein the emitter-coupled differential transistor pair comprises a first input transistor and a second input transistor, the first input transistor comprising an emitter electrically connected to an emitter of the second input transistor and a base configured to receive the first input signal and the first compensation current, the second input transistor comprising a base configured to receive the second input signal and the second compensation current.

11. The amplifier of claim 9 wherein the current mirror comprises a first current mirror transistor comprising a collector electrically connected to the collector of the current buffer transistor, a second current mirror transistor comprising a collector configured to provide at least a portion of the compensation current and electrically connected to the base of the first input transistor, and a third current mirror transistor comprising a collector configured to provide at least another portion of the compensation current and electrically connected to the base of the second input transistor, the third current mirror transistor further comprising a base electrically connected to a base of the second current mirror transistor and a base and the collector of the first current mirror transistor.

12. The amplifier of claim 9 wherein the first input transistor, the second input transistor, and the current source transistor comprise super-beta transistors having similar current gain ($\beta$) values.

13. The amplifier of claim 9 wherein a voltage across the resistor is based at least in part on a ratio of the areas of the first, second, third, and fourth amplifier transistors.

14. The amplifier of claim 9 wherein a voltage across the resistor is based at least in part on a ratio of the aspect ratios of the first, second, third, and fourth amplifier transistors.

15. The amplifier of claim 9 further comprising:
a diode-configured transistor comprising a collector configured to receive a current from a first current source and electrically connected to a base of the diode-configured transistor, and an emitter electrically connected to the collector of the third amplifier transistor and the base of the first current buffer transistor; and
a second current buffer transistor comprising a base electrically connected to the base of the diode-configured transistor, an emitter electrically connected to the collector of the first current buffer transistor, and a collector electrically connected to the collector of the first current mirror transistor.

16. A method of compensating for amplifier input bias current, the method comprising:

receiving a first compensation current at a first input and receiving a second compensation current at a second input of an emitter-coupled differential input transistor pair of an amplifier;

providing a tail current of the emitter-coupled differential input transistor pair from a current source comprising a current source transistor and a degeneration resistor, a collector of the current source transistor configured to provide the tail current;

regulating the tail current through the degeneration resistor by setting a positive input of a local amplifier to a voltage, electrically connecting a negative input of the local amplifier to a node formed between a first terminal of the degeneration resistor and an emitter of the current source transistor, and electrically connecting an output of the local amplifier to a base of a common base transistor, an emitter of the common base transistor electrically connected to a base of the current source transistor, a collector of the common base transistor configured to provide a third compensation current to a current mirror; and mirroring using the current mirror the third compensation current by approximately half to each of the first and second inputs of the emitter-coupled differential input transistor pair to provide the first and second compensation currents.

17. The method of claim 16 wherein the voltage comprises a desired tail current through the degeneration resistor.

18. The method of claim 16 wherein the emitter-coupled differential input transistor pair and the current source transistor comprise super-beta transistors have approximately similar current gain ($\beta$) values.

19. The method of claim 16 further comprising biasing the current source.

20. The method of claim 16 wherein the compensation current is based at least in part on the current gain ($\beta$) of the current source transistor.

* * * * *